(12) United States Patent
Tsuneoka et al.

(10) Patent No.: US 7,187,071 B2
(45) Date of Patent: Mar. 6, 2007

(54) COMPOSITE ELECTRONIC COMPONENT

(75) Inventors: Michiaki Tsuneoka, Osaka (JP);
Yasuhiro Sugaya, Osaka (JP); Masaaki Katsumata, Osaka (JP); Joji Fujiwara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/565,569

(22) PCT Filed: Apr. 28, 2005

(86) PCT No.: PCT/JP2005/008140

§ 371 (c)(1),
(2), (4) Date: Jan. 23, 2006

(87) PCT Pub. No.: WO2005/122247

PCT Pub. Date: Dec. 22, 2005

(65) Prior Publication Data

US 2006/0244123 A1    Nov. 2, 2006

(30) Foreign Application Priority Data

Jun. 10, 2004  (JP)  .............................. 2004-172141

(51) Int. Cl.
*H01L 23/522* (2006.01)
(52) U.S. Cl. ............... 257/691; 257/207; 257/E23.079; 257/E23.153
(58) Field of Classification Search .................. 257/691
See application file for complete search history.

(56) References Cited

U.S. PATENT DOCUMENTS 5,155,655 A    10/1992    Howard et al.
5,883,428 A *   3/1999    Kabumoto et al. ......... 257/691
7,095,117 B2 *  8/2006    Suwa et al. .................. 257/738
7,129,571 B2 * 10/2006    Kang .......................... 257/678

(Continued)

FOREIGN PATENT DOCUMENTS

JP    05-500136        1/1993
JP    05-315470 A     11/1993

(Continued)

OTHER PUBLICATIONS

Japanese Search Report for PCT/JP2005-008140, dated Aug. 9, 2005, with English translation.

*Primary Examiner*—Thao X. Le
*Assistant Examiner*—Abul Kalam
(74) *Attorney, Agent, or Firm*—RatnerPrestia

(57) ABSTRACT

A composite electronic component having a multi-layer wiring board, a first power terminal electrode, a second power terminal electrode, an external connection power supply terminal, a surface-mounted component, an insulator, and a power supply pattern. The first and the second power terminal electrodes are disposed on a first face of the multi-layer wiring board. The external connection power supply terminal is disposed on a second face opposite to the first face of the multi-layer wiring board and connected with the first power terminal electrode. The surface-mounted component is mounted on the first face of the multi-layer wiring board and connected with the first and the second power terminal electrodes at a first face thereof. The insulator covers at least a second face opposite to the first face of the surface-mounted component, the first power terminal electrode, and the second power terminal electrode with a first face thereof. The power supply pattern is disposed on a second face opposite to the first face of the insulator and connected with the first and the second power terminal electrodes.

7 Claims, 3 Drawing Sheets

U.S. PATENT DOCUMENTS

| | | | |
|---|---|---|---|
| 2003/0194832 A1* | 10/2003 | Lopata et al. | 438/108 |
| 2004/0232452 A1* | 11/2004 | Tsuneoka et al. | 257/222 |
| 2004/0252475 A1* | 12/2004 | Tsuneoka et al. | 361/816 |

FOREIGN PATENT DOCUMENTS

| | | |
|---|---|---|
| JP | 2002-151633 A | 5/2002 |
| JP | 2004-297054 A | 10/2004 |

* cited by examiner

COMPOSITE ELECTRONIC COMPONENT

This application is a U.S. National Phase Application of PCT International Application PCT/JP2005/008140, filed Apr. 28, 2005.

TECHNICAL FIELD

The present invention relates to a composite electronic component provided by mounting a surface-mounted component on a multi-layer wiring board.

BACKGROUND ART

FIG. 4 is a sectional view schematically showing a conventional composite electronic component. The composite electronic component has surface-mounted component (hereinafter called "component") 3, such as a semiconductor device requiring a control voltage, mounted on multi-layer wiring board (hereinafter called "board") 1. On the surface of board 1, there are disposed power terminal electrodes (hereinafter called "electrodes") 2, and component 3 is mounted so as to be connected with electrodes 2.

In some of such composite electronic components, a plurality of control voltages for synchronous control are applied to component 3. In such a case, the control of the composite electronic component is being simplified by dividing external connection power supply terminal 4, which is disposed on the lower face of board 1, into branch circuits. One of the branch circuits is routed within board 1. A composite electronic component as noted above is disclosed, for example, in Japanese Translation of PCT Publication No. H05-500136.

There has been an increasing demand for miniaturization of small wireless communications apparatuses such as those for use in mobile telephones and the wireless LAN. To meet such a demand, it is required to miniaturize the composite electronic components. Therefore, it becomes necessary to mount component 3 requiring various types of control on board 1. However, routed portion 5 of the power supply path within board 1 becomes a cause of unnecessary coupling with other circuit electrodes 6 disposed within board 1 in a high-frequency range. Thus, it is necessary to increase inter-electrode distances and this makes it difficult to miniaturize the composite electronic component.

SUMMARY OF INVENTION

A composite electronic component of the present invention has a multi-layer wiring board, a first power terminal electrode, a second power terminal electrode, an external connection power supply terminal, a surface-mounted component, an insulator, and a power supply pattern. The first power terminal electrode and the second power terminal electrode are disposed on a first face of the multi-layer wiring board. The external connection power supply terminal is disposed on a second face opposite to the first face of the multi-layer wiring board and connected with the first power terminal electrode. The surface-mounted component is mounted on the first face of the multi-layer wiring board and connected with the first power terminal electrode and the second power terminal electrode at a first face of the surface-mounted component. The insulator covers at least a second face opposite to the first face of the surface-mounted component, as well as the first power terminal electrode and the second power terminal electrode with a first face of the insulator. The power supply pattern is disposed on a second face opposite to the first face of the insulator and connected with the first power terminal electrode and the second power terminal electrode. According to the configuration described above, the power supply pattern as a power supply path branched from a path connecting the external connection power supply terminal with the first power terminal electrode comes to be located outside the multi-layer wiring board. Therefore, unwanted coupling within the multi-layer wiring board can be suppressed and thus miniaturization of the composite electronic component can be attained.

| DESCRIPTION OF REFERENCE MARKS | |
|---|---|
| 1 | multi-layer wiring board |
| 2 | power terminal electrode |
| 3 | surface-mounted component |
| 4 | power supply terminal |
| 5 | routed portion |
| 6 | circuit electrode |
| 7 | multi-layer wiring board |
| 7A | upper face |
| 7B | lower face |
| 8 | surface-mounted component |
| 8A | upper face |
| 8B | lower face |
| 9 | circuit electrode |
| 10 | first power terminal electrode |
| 11 | second power terminal electrode |
| 12 | external connection power supply terminal |
| 13 | insulator |
| 13A | upper face |
| 13B | lower face |
| 13C, 13D | side face |
| 14, 16, 20, 25 | via |
| 15 | power supply pattern |
| 17 | dielectric member |
| 17A | upper face |
| 17B | lower face |
| 18 | grounding electrode |
| 19 | external connection grounding electrode |
| 21 | internal grounding electrode |
| 21A | internal electrode |
| 22 | large-sized board |
| 22A | upper face |
| 22B | lower face |

-continued

DESCRIPTION OF REFERENCE MARKS

| | |
|---|---|
| 23 | large-sized insulator |
| 24 | large-sized dielectric member |
| 31,32 | conductive layer |
| 33 | insulating layer |

DETAILED DESCRIPTION OF PREFERRED EMBODIMENTS

Figure 1:
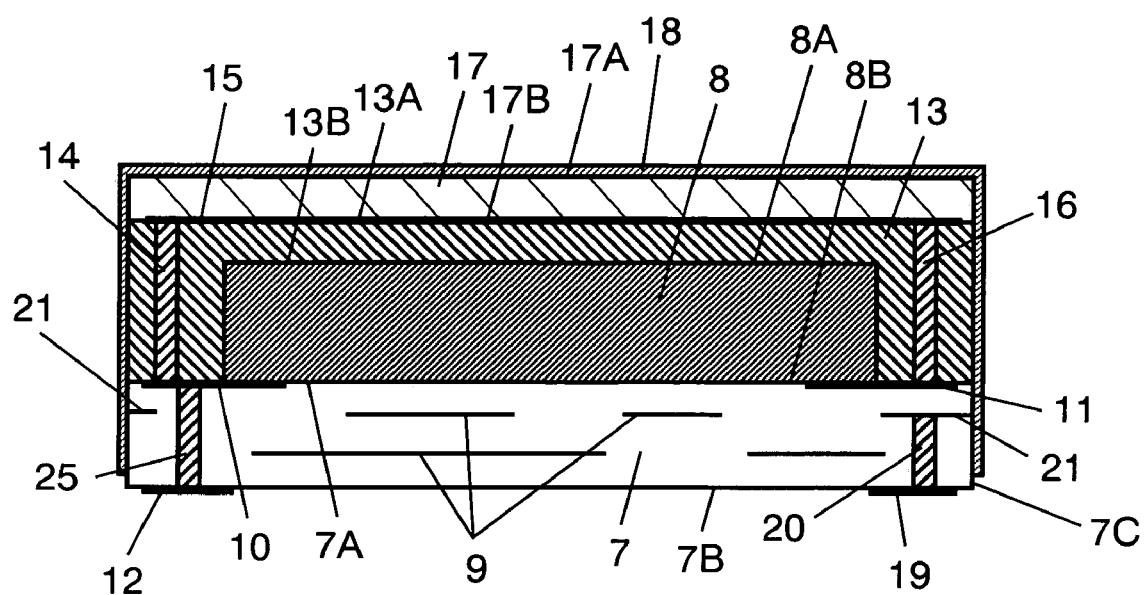
FIG. 1 is a sectional view schematically showing a composite electronic component according to an embodiment of the present invention.

FIG. 1 is a schematic sectional view schematically showing a configuration of a composite electronic component having a surface-mounted component mounted on a multi-layer wiring board, according to an embodiment of the present invention. Multi-layer wiring board (hereinafter called "board") 7 is formed by laminating insulating layers of resin. Between the layers, there are disposed circuit electrodes (hereinafter called "electrode") 9 for forming a high-frequency circuit with use of capacitors, inductors, and the like. On upper face 7A as a first face of board 7, there are disposed first and second power terminal electrodes (hereinafter called "electrodes") 10, 11, while on lower face 7B as a second face opposite to the first face, there is disposed external connection power supply terminal (hereinafter called "terminal") 12. Electrode 10 and terminal 12 are connected by way of via 25. Surface-mounted component (hereinafter called "component") 8 is controlled for its operation by control voltages input from electrodes 10, 11. Applications of control voltages from electrodes 10, 11 in particular are synchronous controlled.

The composite electronic component has electrodes 10, 11 requiring synchronous control and power supply pattern 15. Insulator 13 covers at least upper face 8A of component 8 and electrodes 10, 11 with lower face 13B as a first face thereof. Power supply pattern 15 is disposed on upper face 13A as a second face opposite to lower face 13B of insulator 13, and is connected with electrode 10 by way of via 14 as a first via. On the other hand, electrode 11 is connected with power supply pattern 15 by way of via 16 as a second via. Component 8 is connected with electrodes 10, 11 disposed on upper face 7A of board 7 at lower face 8B thereof. Lower face 8B of component 8 is defined as a first face and upper face 8A thereof opposite to lower face 8B is defined as a second face. By virtue of such a configuration, electrode 11 is connected with electrode 10 and then with terminal 12.

In the configuration described above, power supply pattern 15 corresponding to a routed portion branched from a path that connects terminal 12 with electrode 10 and led toward electrode 11, comes to be located outside board 7. Hence, unwanted coupling occurring inside board 7 can be suppressed and electrodes 9 disposed within board 7 can be distributed in a higher-density. Thus, the composite electronic component can be miniaturized.

When power supply pattern 15 is exposed on the surface of the composite electronic component, such the composite electronic component handling high-frequency waves may adversely affect peripheral equipment to which the composite electronic component is attached. Therefore, it is preferred that dielectric member 17 is disposed so as to cover power supply pattern 15 with lower face 17B thereof as a first face, and that grounding electrode (hereinafter called "electrode") 18 is disposed on upper face 17A as a second face opposite to lower face 17B of dielectric member 17.

By the above described configuration, while the shielding characteristic of the composite electronic component is secured, power supply pattern 15 and electrode 18 can be disposed to oppose each other with dielectric member 17 interposed therebetween. As a result, grounded capacity is produced between power supply pattern 15 and electrode 18. This grounded capacity connected to electrodes 10, 11 serves as a bypass capacitor for noise reduction for component 8. This eliminates the need for arrangement of capacitor elements around electrodes 10, 11, so that the composite electronic component can be made further miniaturized.

The grounding path of electrode 18 can be easily secured by making the following configuration. That is, external connection grounding electrode (hereinafter called "electrode") 19 is disposed on lower face 7B of board 7. Further, internal grounding electrode (hereinafter called "electrode") 21 is disposed in an internal layer of board 7 so as to be connected with electrode 19 by way of via 20. An edge of electrode 21 is exposed on side face 7C of board 7 and the exposed portion is connected to grounding electrode 18. Side face 7C is the face between upper face 7A and lower face 7B.

Via 14, 16 is generally formed with an electrode paste of silver-based material or the like having high conductivity. Via 14, 16 form a path for applying a control voltage. Therefore, if a resistive element is added to at least one of vias 14, 16 instead of the highly conductive electrode paste, a pull-up resistor or a pull-down resistor for component 8 can be provided in one of vias 14, 16. Thus, the composite electronic component can be made further miniaturized. In the addition of a resistive element to via 14, 16, the values of the resistive components of via 14, 16 can be controlled as required by adding a paste containing a resistive element to the highly conductive electrode paste. Otherwise, via 14, 16 may be formed of a paste having a resistive component. Such a paste having a resistive component can be prepared by using, for example, carbon, $LaB_6$ ceramic.

Figure 2A:
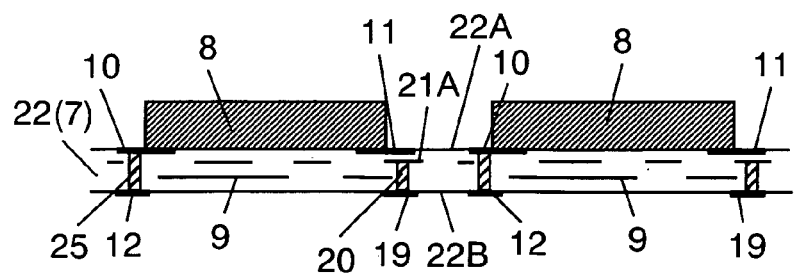
FIG. 2A is a sectional view showing a manufacturing method of the composite electronic component shown in FIG. 1.

A manufacturing method to realize the configuration noted above will be described with reference to FIG. 2A–FIG. 2E. First, components 8 are suitably mounted on large-sized board 22, for multi-piece producing of boards 7 therefrom, as shown in FIG. 2A. On upper face 22A as a first face of large-sized board 22, there have previously been disposed multiple sets of electrodes 10, 11 at predetermined positions. On lower face 22B as a second face opposite to upper face 22A, there have previously been disposed multiple sets of electrode 19 and terminal 12. Electrode 19 is connected with internal electrode (hereinafter called "electrode") 21A by way of via 20, while terminal 12 is connected with electrode 10 by way of via 25.

Figure 2B:
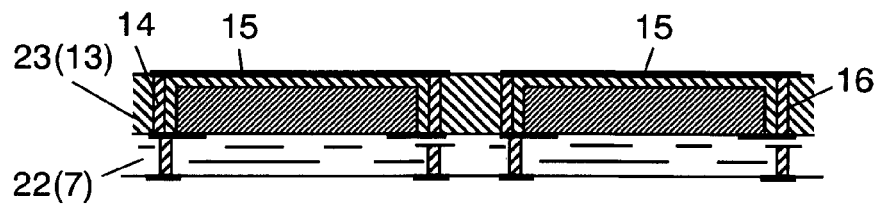
FIG. 2B is a sectional view showing the manufacturing method, in a stage following FIG. 2A, of the composite electronic component shown in FIG. 1.
Figure 2C:
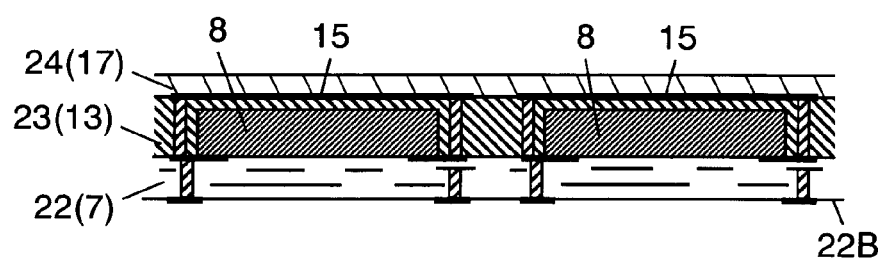
FIG. 2C is a sectional view showing the manufacturing method, in a stage following FIG. 2B, of the composite electronic component shown in FIG. 1.

Then, large-sized insulator 23 is mounted over the intermediate product as shown in FIG. 2B. Large-sized insulator 23 has previously been provided with recessed portions for accommodating components 8 and with vias 14 at positions communicating with electrodes 10. Then, on the surface thereof, suitable power supply patterns 15 are selectively formed. Then, as shown in FIG. 2C, large-sized dielectric member 24 is mounted over the same and they are integrated together. For large-sized insulator 23, a mixture of inorganic filler and a thermosetting resin material is used for example. A representative material of the same is a composite material formed of a mixture of a silica filler and an epoxy resin material. Large-sized dielectric member 24 can for example be formed of an inorganic filler and a thermosetting resin material as with large-sized insulator 23, however, a material having a high relative permittivity, such as barium titanate, is used for the filler.

Figure 2D:
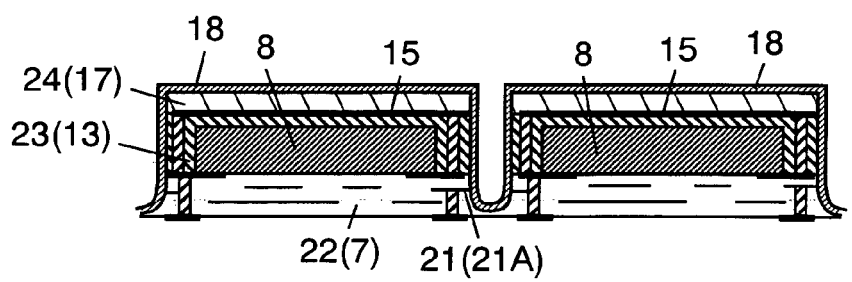
FIG. 2D is a sectional view showing the manufacturing method, in a stage following FIG. 2C, of the composite electronic component shown in FIG. 1.
Figure 2E:
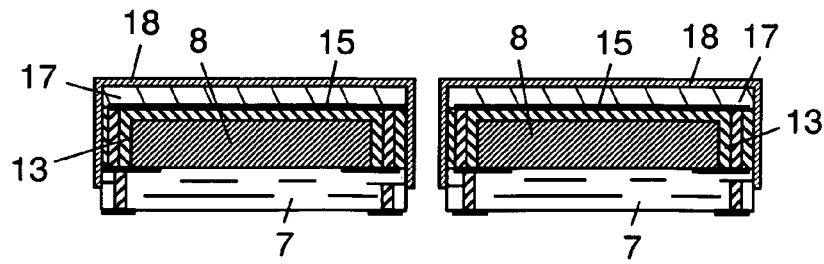
FIG. 2E is a sectional view showing the manufacturing method, in a stage following FIG. 2D, of the composite electronic component shown in FIG. 1.

Then, half-dicing is performed on large-sized board 22 such that a portion thereof toward the side of lower face 22C is left uncut as shown in FIG. 2D. At this time, electrode 21 is formed such that the edge of electrode 21A is exposed. Namely, the half-dicing is performed at the edge of electrode 21A or a portion of electrode 21A is also cut off at the time of the half-dicing. Thereafter, electrode 18 is formed over the surface of the intermediate product. Then, by dividing the intermediate product into individual pieces as shown in FIG. 2E, a plurality of composite electronic components of the present embodiment can be obtained.

With respect to the composite electronic component according to the present embodiment, there has so far been described a configuration in which only one set of component 8 requiring synchronous control and electrodes 10, 11 connected thereto, is mounted on board 7. However, the present invention is not limited to such a configuration. Similar operational effects can be obtained even with such a configuration in which a greater number of power terminal electrodes than electrodes 10, 11 are additionally used and power terminal electrodes for them requiring synchronous control are connected with each other. Similar operational effects can also be obtained with such a configuration in which a plurality of components 8 are mounted on board 7 and power terminal electrodes requiring synchronous control between the plurality of components are connected with each other.

Figure 3:
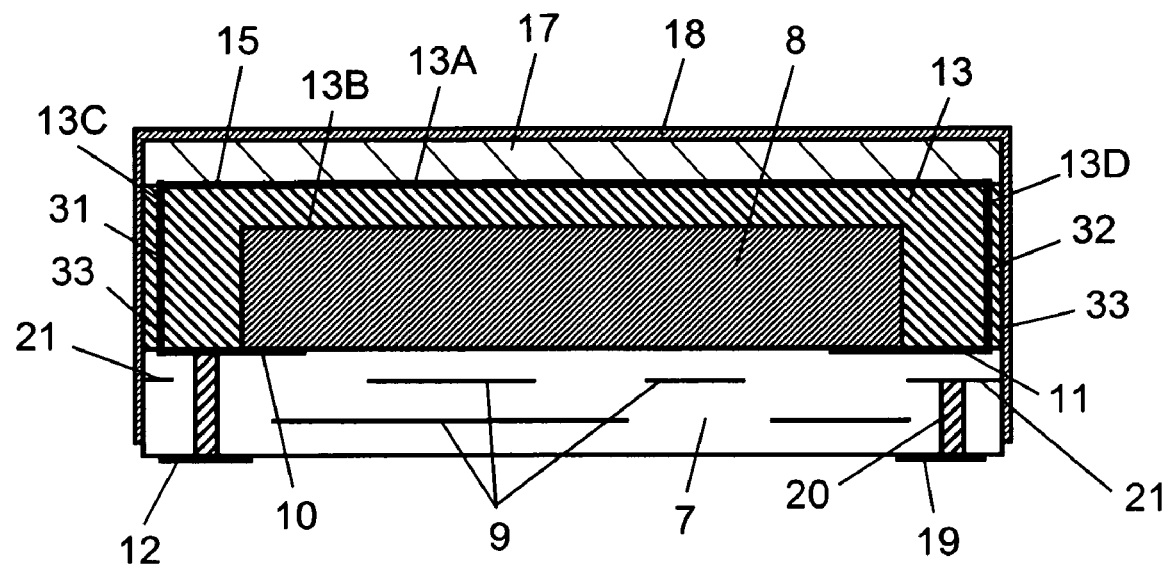
FIG. 3 is a sectional view schematically showing another configuration of the composite electronic component according to the embodiment of the present invention.
Figure 4:
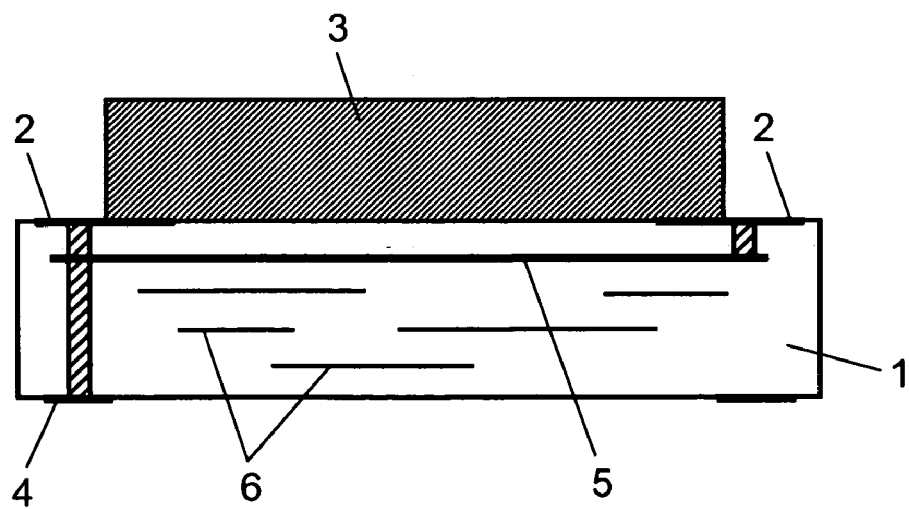
FIG. 4 is a sectional view schematically showing a conventional composite electronic component.

In the description given above, electrode 10 is connected with power supply pattern 15 by way of via 14, while electrode 11 is connected with power supply pattern 15 by way of via 16. The present invention is not limited to such an arrangement. For example, as shown in FIG. 3, conductive layer 31 connecting electrode 10 and power supply pattern 15 together may be disposed on side face 13C as a third face located between upper face 13A and lower face 13B of insulator 13, and, further, conductive layer 32 connecting electrode 11 and power supply pattern 15 together may be disposed on side face 13D as a fourth face opposite to side face 13C. This arrangement is also possible. Conductive layer 31 is defined as a first conductive layer and conductive layer 32 as a second conductive layer. In this case, electrode 18 is insulated from conductive layer 31, 32 by providing insulating layer 33 on conductive layer 31, 32. Also in this case, by having conductive layer 31, 32 formed of a resistor member, the same effect as obtained in the configuration of FIG. 1 can be obtained.

INDUSTRIAL APPLICABILITY

Since the composite electronic component of the present invention is capable of being miniaturized, it is useful when applied to wireless communications of which miniaturization is particularly required, such as cards for the wireless LAN and mobile telephones.

The invention claimed is:

1. A composite electronic component comprising:
 a multi-layer wiring board;
 a first power terminal electrode and a second power terminal electrode disposed on a first face of the multi-layer wiring board;
 an external connection power supply terminal disposed on a second face opposite to the first face of the multi-layer wiring board and connected to the first power terminal electrode;
 a surface-mounted component mounted on the first face of the multi-layer wiring board and connected with the first power terminal electrode and the second power terminal electrode at a first face of the surface-mounted component;
 an insulator covering at least a second face opposite to the first face of the surface-mounted component, the first power terminal electrode and the second power terminal electrode with a first face of the insulator; and
 a power supply pattern disposed on a second face opposite to the first face of the insulator and connected with the first power terminal electrode and the second power terminal electrode.

2. The composite-electronic component according to claim 1, further comprising:
 a dielectric member covering the power supply pattern with a first face of the dielectric member; and
 a grounding electrode disposed on a second face opposite to the first face of the dielectric member.

3. The composite electronic component according to claim 2, further comprising:
 an internal grounding electrode disposed within an internal layer of the multi-layer wiring board, the internal grounding electrode having an edge portion exposed on a third face between the first face and the second face of the multi-layer wiring board, the edge portion being connected with the grounding electrode; and
 an external connection grounding electrode disposed on the second face of the multi-layer wiring board, and connected with the internal grounding electrode.

4. The composite electronic component according to claim 1, further comprising:
 a first via provided in the insulator for connecting the first power terminal electrode with the power supply pattern; and
 a second via provided in the insulator for connecting the second power terminal electrode with the power supply pattern.

5. The composite electronic component according to claim 4, wherein at least one of the first via and the second via is a resistor.

6. The composite electronic component according to claim 1, further comprising:
 a first conductive layer disposed on a third face between the first face and the second face of the insulator for connecting the first power terminal electrode and the power supply pattern; and
 a second conductive layer disposed on a fourth face opposite to the third face of the insulator for connecting the second power terminal electrode and the power supply pattern.

7. The composite electronic component according to claim 6, wherein at least one of the first conductive layer and the second conductive layer is a resistor.

* * * * *